United States Patent
Yoshimoto

(10) Patent No.: US 12,421,044 B2
(45) Date of Patent: Sep. 23, 2025

(54) AUTOMATED WAREHOUSE

(71) Applicant: Daifuku Co., Ltd., Osaka (JP)

(72) Inventor: Tadahiro Yoshimoto, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 558 days.

(21) Appl. No.: 17/977,328

(22) Filed: Oct. 31, 2022

(65) Prior Publication Data
US 2023/0139400 A1    May 4, 2023

(30) Foreign Application Priority Data
Nov. 1, 2021    (JP) .................................. 2021-178753

(51) Int. Cl.
    *B65G 1/137*    (2006.01)
(52) U.S. Cl.
    CPC .................................. *B65G 1/1375* (2013.01)
(58) Field of Classification Search
    CPC .................................................. B65G 1/1375
    See application file for complete search history.

(56) References Cited

U.S. PATENT DOCUMENTS

| | | | | |
|---|---|---|---|---|
| 5,927,926 A | * | 7/1999 | Yagi ..................... | B65G 1/0407 414/280 |
| 10,351,342 B2 | * | 7/2019 | Rauwerdink ........ | A47B 47/027 |
| 2008/0131249 A1 | * | 6/2008 | Yoshida ............. | H01L 21/6773 414/679 |
| 2012/0045302 A1 | * | 2/2012 | Iizuka ............... | H01L 21/67769 414/287 |

FOREIGN PATENT DOCUMENTS

| | | |
|---|---|---|
| JP | S5445085 A | 4/1979 |
| JP | S6053705 U | 4/1985 |
| JP | 2001261130 A | 9/2001 |
| JP | 2009126682 A | 6/2009 |
| WO | 2015052998 A1 | 4/2015 |

* cited by examiner

*Primary Examiner* — Kyle O Logan
(74) *Attorney, Agent, or Firm* — The Webb Law Firm

(57) ABSTRACT

An automated warehouse includes a placement section module that is slidably supported by a frame member via a slide mechanism. The slide mechanism supports the placement section module in such a manner that the placement section module is slidable relative to the frame member between a reference position and a protruding position. A cover member covers a face of the placement section module on a back face side in a depth direction. When the placement section module is at the protruding position, an upper side of storage regions is exposed.

4 Claims, 9 Drawing Sheets

AUTOMATED WAREHOUSE

CROSS-REFERENCE TO RELATED APPLICATION

This application claims priority to Japanese Patent Application No. 2021-178753 filed Nov. 1, 2021, the disclosure of which is hereby incorporated by reference in its entirety.

BACKGROUND OF THE INVENTION

1. Field of the Invention

The present invention relates to an automated warehouse that includes a storage rack capable of storing a plurality of articles and a transport apparatus configured to travel along a front face of the storage rack and transport the articles.

2. Description of the Related Art

WO 2015/052998 discloses an example of such an automated warehouse. In the following description of the related art, reference numerals or names shown in parentheses are those used in WO 2015/052998.

The automated warehouse described in WO 2015/052998 includes a storage rack (stocker 2) for storing articles, a drawer unit (4) configured to be capable of being inserted into and drawn out from the storage rack (stocker 2), and a transport apparatus (50). The drawer unit (4) includes a plurality of placement sections (shelves 14) for placing containers, which are next to each other in an up-down direction. That is, the drawer unit (4) serves as a portion of the storage rack (stocker 2) to store articles. Also, the drawer unit (4) is configured to be drawn out from a back face of the storage rack (stocker 2) to open an entrance to the inside of the storage rack (stocker 2) for workers.

The above-described configuration of the automated warehouse allows a worker to draw out the drawer unit (4) from the back face of the storage rack (stocker 2) to take out an article placed on a placement section (shelf 14) of the drawer unit (4) in a case where the transport apparatus (50) cannot be operated due to a power failure or breakdown, for example. However, the plurality of placement sections (shelves 14) are arranged in the up-down direction, and accordingly, the worker is obstructed by a placement section (shelf 14) right above the article to be taken out, and it is not easy for the worker to take out the article particularly in a case where the article is heavy. On the other hand, in order to make it easy for the worker to take out the article, the distance in the up-down direction between the article placed on the placement section (shelf 14) and the placement section (shelf 14) right above the article needs to be made larger than a distance necessary for the worker to lift the article. Accordingly, the distance between the plurality of placement sections (shelves 14) in the up-down direction is likely to be large, which causes a reduction in an efficiency of storing articles in the automated warehouse.

SUMMARY OF THE INVENTION

Therefore, in view of the foregoing, there is demand for realizing an automated warehouse that makes it easy for workers to take out an article from the back face side of the storage rack while avoiding a reduction in the efficiency of storing articles. An automated warehouse according to the present disclosure is characterized in including: a storage rack configured to store a plurality of articles; and a transport apparatus configured to travel along a front face of the storage rack and transport the articles, wherein the storage rack includes: a plurality of placement sections on which the articles are placeable; a frame member supporting the plurality of placement sections; and a cover, the cover covers a back face of the storage rack, the plurality of placement sections are next to each other in both an up-down direction and a width direction orthogonal to the up-down direction as viewed in a depth direction that is a direction from the front face toward the back face or from the back face toward the front face, and storage regions in which the articles are storable are respectively formed between pairs of two placement sections adjacent to each other in the up-down direction, the automated warehouse further includes at least one placement section module including at least one placement section, the at least one placement section including one of the placement sections or a plurality of the placement sections adjacent to each other in the width direction, the at least one placement section module is supported by the frame member via a slide mechanism, the slide mechanism supports the at least one placement section module in such a manner that the at least one placement section module is slidable relative to the frame member between a reference position and a protruding position that is on a back face side in the depth direction relative to the reference position, the back face side in the depth direction being the back face side as seen from the front face side in the depth direction, when the at least one placement section module is at the reference position, the at least one placement section is on a front face side in the depth direction relative to a frame member back surface that is a surface of the frame member on the back face side in the depth direction, the front face side in the depth direction being the front face side as seen from the back face side in the depth direction, when the at least one placement section module is at the protruding position, the at least one placement section protrudes from the frame member back surface toward the back face side in the depth direction, the cover includes a cover member covering a face of the at least one placement section module on the back face side in the depth direction, and the at least one placement section module is configured in such a manner that an upper side of the storage regions is exposed in a state where the at least one placement section module is at the protruding position.

According to this configuration, when the placement section module is slid to the protruding position, articles can be easily taken out from the upper side of the placement section module. Also, when the placement section module is at the reference position, the back face of the storage rack can be covered with the cover including the cover member.

As described above, the automated warehouse is configured to take out articles from the upper side of the placement section module in the state where the placement section module has been slid to the protruding position, and therefore, a worker can easily take out articles when compared with a case where the cover covering the back face of the plurality of placement sections is merely removed to take out articles in the depth direction. Moreover, there is no need to make the distance between the plurality of placement sections in the up-down direction large in order to make it easy for the worker to take out articles as in the case where articles are taken out in the depth direction, and therefore, it is easy to increase the efficiency of storing articles in the storage rack.

Further features and advantages of the automated warehouse will be clarified by exemplary and non-limiting embodiments described below with reference to the drawings.

DESCRIPTION OF THE INVENTION

1. Automated Warehouse

Figure 1:
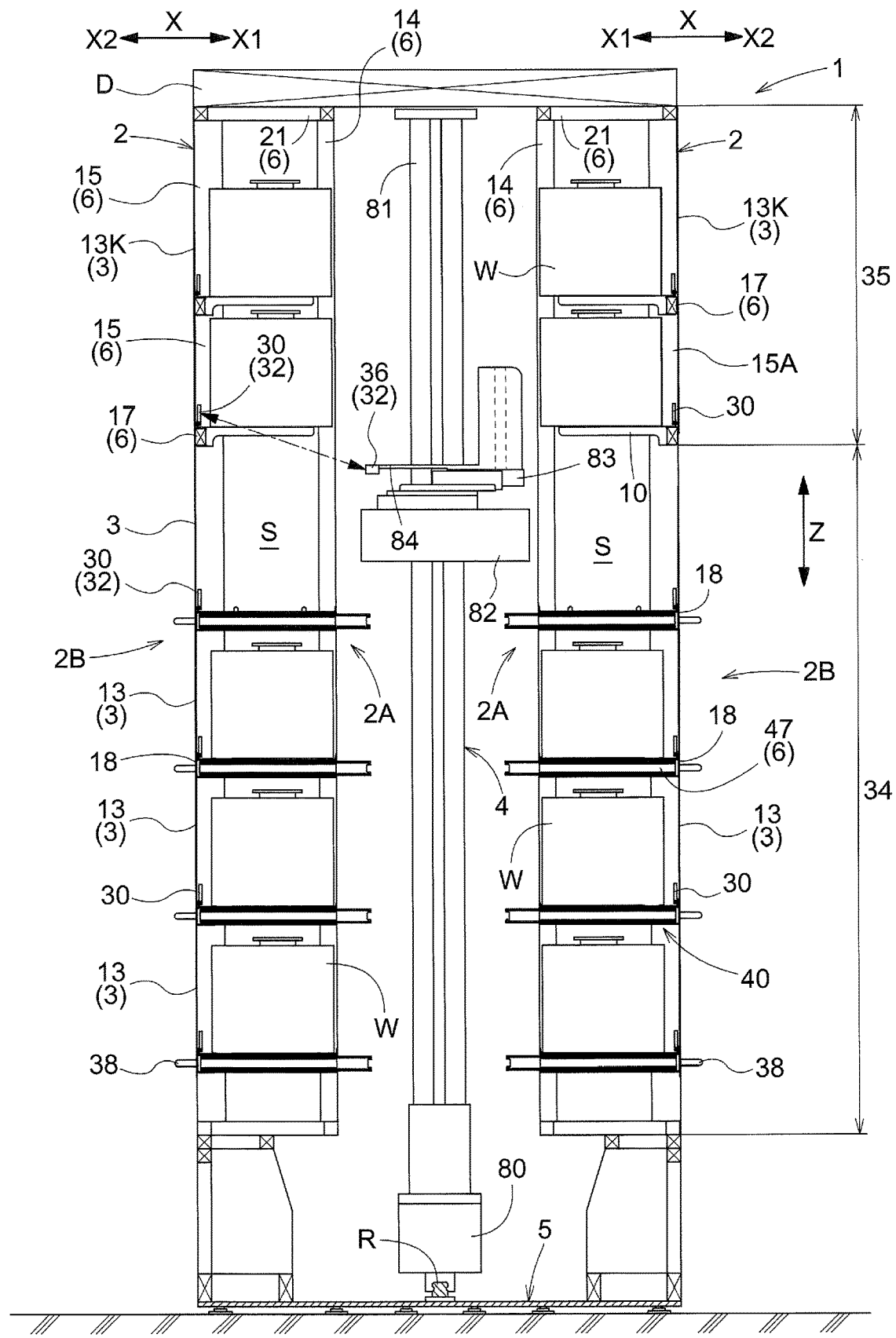
FIG. 1 shows a cross section of an automated warehouse viewed in a width direction.

First, an embodiment of an automated warehouse will be described based on the drawings. As shown in FIG. 1, the automated warehouse 1 includes a storage rack 2 capable of storing a plurality of articles W and a transport apparatus 4 configured to travel along a front face 2A of the storage rack 2 and transport articles W. In the illustrated example, the automated warehouse 1 includes a pair of storage racks 2 facing each other with the transport apparatus 4 located therebetween. In this example, the articles W are FOUPs (Front Opening Unified Pods) for storing semiconductor substrates (wafers).

Figure 2:
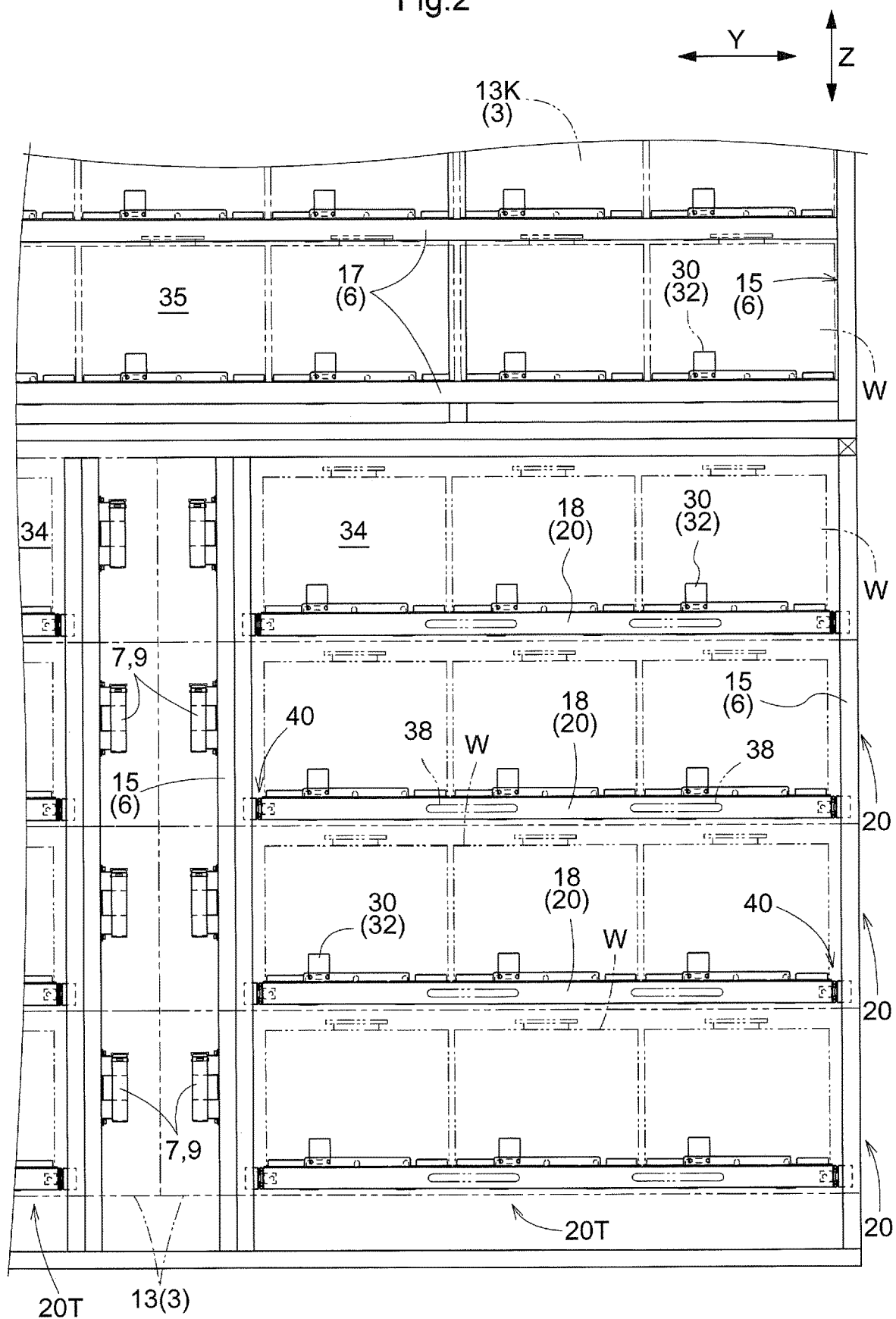
FIG. 2 is a partial enlarged view of a back face of a storage rack.

The following describes each configuration of the automated warehouse 1. As shown in FIGS. 1 and 2, a direction from the front face 2A toward a back face 2B of each of the pair of storage racks 2 or from the back face 2B toward the front face 2A will be referred to as a "depth direction X". A direction orthogonal to an up-down direction Z as viewed in the depth direction X will be referred to as a "width direction Y". The front face 2A side as seen from the back face 2B side in the depth direction X will be referred to as a "front face side X1 in the depth direction", and the back face 2B side as seen from the front face 2A side in the depth direction X will be referred to as a "back face side X2 in the depth direction".

2. Transport Apparatus

The transport apparatus 4 in the present embodiment includes a transfer device 83 as shown in FIG. 1. The transfer device 83 holds an article W and transfers the article W between a placement section 10 of the storage racks 2 and the transfer device 83. The transport apparatus 4 moves the transfer device 83 along the front face 2A of each storage rack 2 in both the width direction Y and the up-down direction Z to transport articles W along the front face 2A of the storage rack 2. In this example, the transport apparatus 4 includes, in addition to the transfer device 83, an aisle 5 extending in the width direction Y along the front face 2A of each storage rack 2, a cart 80 configured to travel along the aisle 5, a support 81 fixed to the cart 80, and an elevation body 82 that supports the transfer device 83 and ascends and descends along the support 81 in the up-down direction Z. The cart 80 moves along the width direction Y while being guided by a rail R installed along the aisle 5. As described above, the transport apparatus 4 in this example is a stacker crane. Also, the transport apparatus 4 receives an article W from any placement section 10 of the storage racks 2 whose front faces 2A are facing the aisle 5, and transports the article W to a carry out port (not shown) for transporting articles W to the outside of the storage racks 2. Also, the transport apparatus 4 receives an article W from a carry-in port (not shown) for transporting articles W from the outside of the storage racks 2, and transports the article W to any placement section 10 of the storage racks 2.

The transfer device 83 is configured to be capable of transferring an article W to any placement section 10 of the pair of storage racks 2 disposed on both sides of the aisle 5 in the depth direction X. Specifically, the transfer device 83 transfers articles W by moving the articles W between the transfer device 83 and transfer target places such as a plurality of placement sections 10 included in the storage racks 2. As described above, the transfer target places for the transfer device 83 include the carry-in port for transporting articles W from the outside of the storage racks 2 and the carry-out port for transporting articles W to the outside of the storage racks 2, in addition to the placement sections 10. In the present embodiment, the transfer device 83 includes a transport support portion 84 configured to support an article W and protrude and retract in the depth direction X. In this example, the transport support portion 84 is configured to support an article W from below. More specifically, the transport support portion 84 includes a plurality of transport protrusions (not shown) that engage with to-be-engaged portions (not shown) of an article W from below, and is configured to support a bottom surface of the article W from below in a state where the plurality of transport protrusions engage with the to-be-engaged portions of the article W from below. In this example, the transfer device 83 is a slide fork-type transfer device.

3. Storage Rack

Each storage rack 2 includes a plurality of placement sections 10 on which articles W are placeable, a frame member 6 supporting the plurality of placement sections 10, and a cover 3. In the present embodiment, each storage rack 2 further includes placement section accessory members 30 corresponding to the respective placement sections 10. As shown in FIG. 1, the front face 2A of each of the pair of storage racks 2 is on the aisle 5 side and extends along the up-down direction Z and the width direction Y adjacent to the aisle 5. In this example, the pair of storage racks 2 are disposed on both sides of the aisle 5 in the depth direction X. Also, the front faces 2A of the pair of storage racks 2 face each other. In the illustrated example, the automated warehouse 1 further includes an airflow generating device D (see FIG. 1). The pair of storage racks 2 are below the airflow generating device D. The airflow generating device D generates an airflow (downflow) flowing from the upper side toward the lower side in the area in which the storage racks 2 and the transport apparatus 4 are present.

3-1. Placement Section

As shown in FIGS. 1 and 2, the plurality of placement sections 10 are next to each other in both the up-down direction Z and the width direction Y, and storage regions S in which articles W are storable are respectively formed between pairs of two placement sections 10 adjacent to each other in the up-down direction Z. In the present embodiment, each of the plurality of placement sections 10 is supported by the frame member 6 in a cantilever manner from the back face side X2 in the depth direction. Each of the plurality of placement sections 10 is configured to allow an article W to be placed in and taken out from the corresponding storage region S from the front face side X1 in the depth direction. In this example, some placement sections 10 among the plurality of placement sections 10 are supported by the frame member 6 via slide mechanisms 40, which will be described later. The remaining placement sections 10 are directly supported by the frame member 6. In the following description, a region in which the placement sections 10 supported by the frame member 6 via the slide mechanisms 40 are located will be referred to as a specific region 34. A region in which the placement sections 10 directly supported by the frame member 6 are located will be referred to as a general region 35. In the illustrated example, out of the plurality of placement sections 10 arranged in the up-down direction Z, placement sections 10 located in a plurality of rows including the bottom row (in this example, the first through fourth rows as counted from the bottom) are supported by the frame member 6 via the slide mechanisms 40, and placement sections 10 located in higher rows are directly supported by the frame member 6. That is, in the illustrated example, the region in which the placement sections 10 in the first through fourth rows as counted from the bottom are located is the specific region 34, and the region in which the placement sections 10 in higher rows are located is the general region 35.

Figure 3:
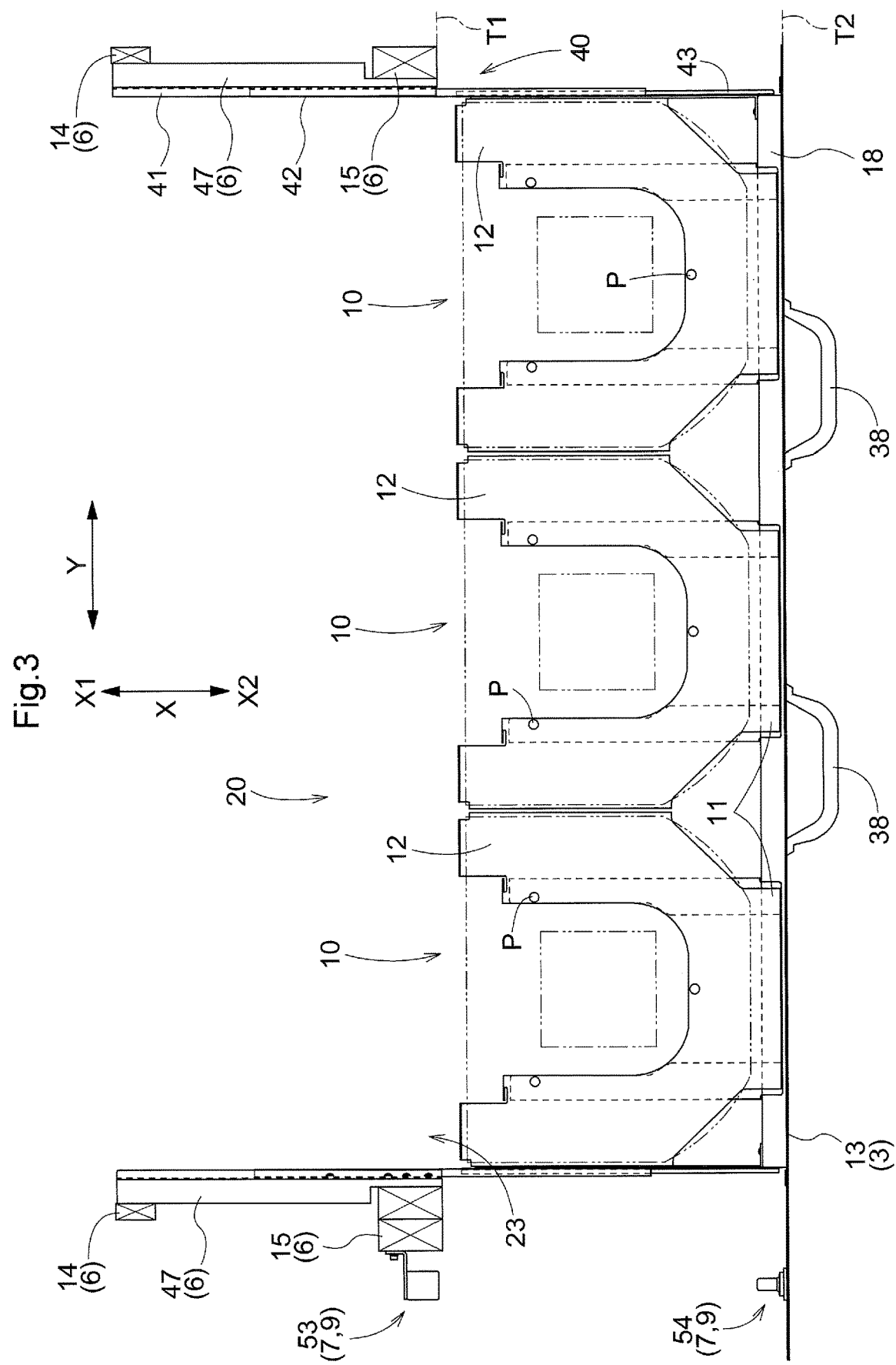
FIG. 3 is a plan view of a placement section module at a protruding position.
Figure 4:
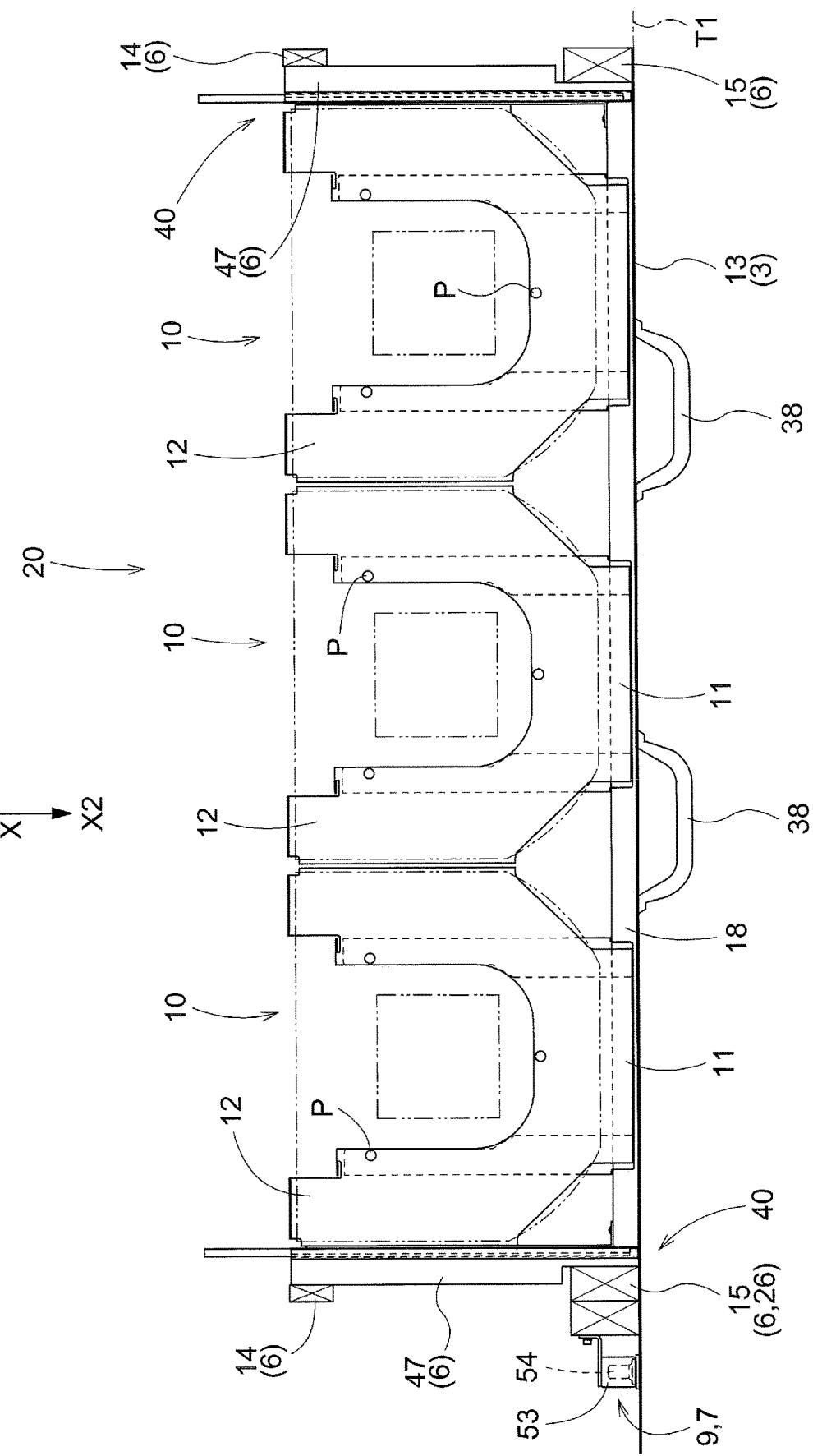
FIG. 4 is a plan view of the placement section module at a reference position.
Figure 7:
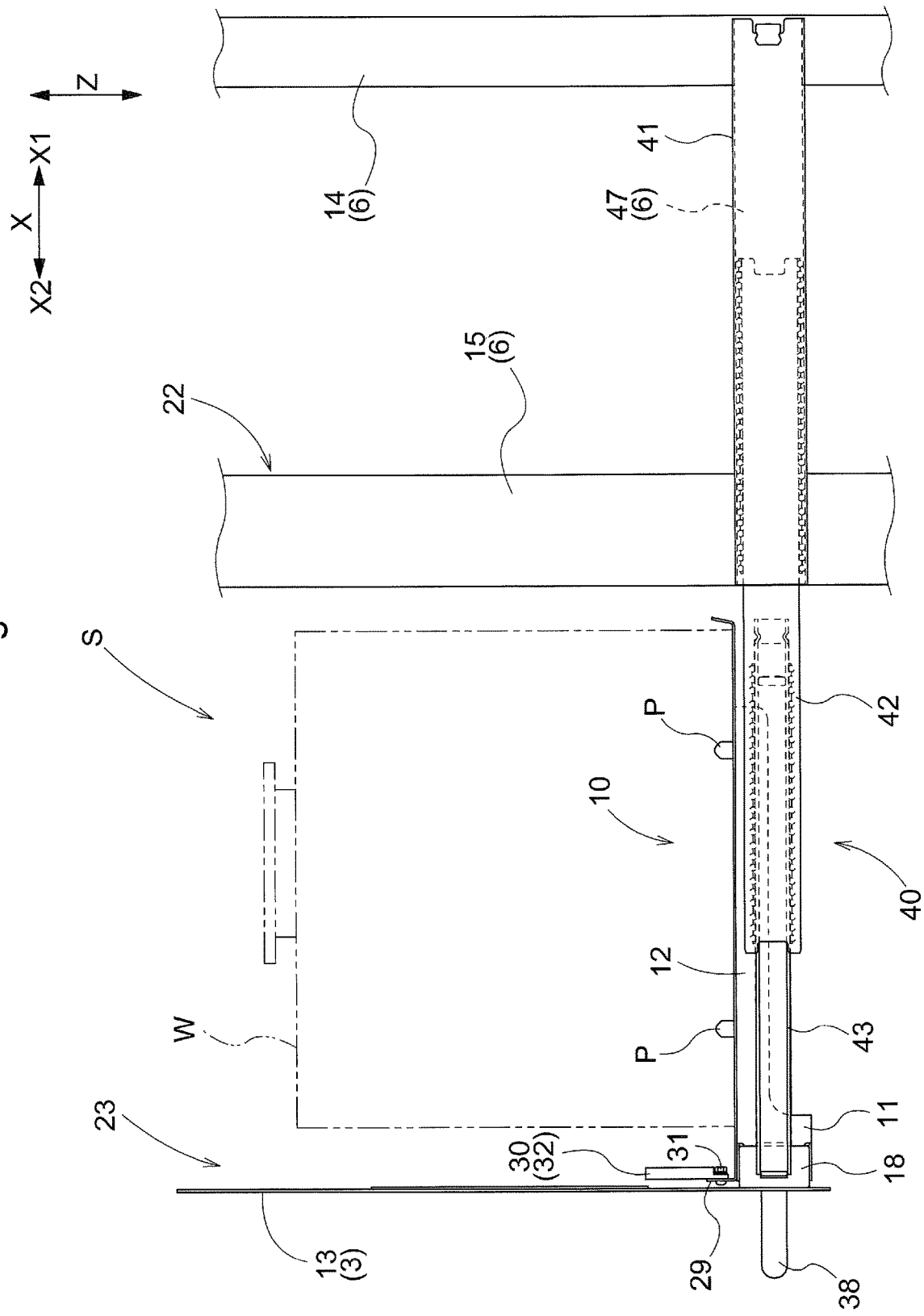
FIG. 7 is a side view of the placement section module at the protruding position and the slide mechanism.

As shown in FIGS. 3, 4, and 7, in the present embodiment, each of the plurality of placement sections 10 includes a support body 12 configured to support a stored article W from below and a fixed portion 11 that is fixed to a support member 18 of a placement section module 20, which will be described later, or the frame member 6. Here, the support body 12 and the fixed portion 11 are formed as a single piece and constituted by the same member. The support body 12 includes a plurality of storage protrusions P that engage with to-be-engaged portions (not shown) of the article W from below (see FIG. 3). The support body 12 is configured to support the bottom surface of the article W from below in a state where the storage protrusions P engage with the to-be-engaged portions of the article W from below.

3-2. Frame Member

Next, the frame member 6 will be described. In this example, the configuration of the frame member 6 differs between the general region 35 and the specific region 34. First, the frame member 6 in the general region 35 will be described. As shown in FIGS. 1 and 2, the frame member 6 includes a plurality of front-face-side supports 14, a plurality of back-face-side supports 15, a plurality of beams 17, and a plurality of connecting beams 21. The plurality of back-face-side supports 15 are disposed separately from each other in the width direction Y on the back face side X2 in the depth direction relative to the plurality of storage regions S. The plurality of front-face-side supports 14 are disposed separately from each other in the width direction Y on the front face side X1 in the depth direction relative to the plurality of storage regions S. Here, the positions of the front-face-side supports 14 in the width direction Y correspond to the back-face-side supports 15. The plurality of connecting beams 21 are disposed separately from each other at a plurality of positions in the up-down direction Z. The connecting beams 21 extend along the depth direction X and connect the front-face-side supports 14 and the back-face-side supports 15 disposed at corresponding positions in the width direction Y. The plurality of beams 17 are disposed separately from each other at a plurality of positions in the up-down direction Z. The beams 17 extend along the width direction Y and connect a pair of back face-side supports 15 adjacent to each other in the width direction Y. In the illustrated example, a pair of connecting beams 21 are disposed separately from each other in the up-down direction Z, and one of the connecting beams 21 connects an upper end portion of a back-face-side support 15 and an upper end portion of a corresponding front-face-side support 14. The other connecting beam 21 connects a lower end portion of the back-face-side support 15 and a lower end portion of the corresponding front-face-side support 14 (see FIG. 1). Also, in the illustrated example, each of the plurality of placement sections 10 in the general region 35 is supported by a beam 17. Specifically, the placement section 10 is directly supported by the frame member 6 with the fixed portion 11 of the placement section 10 fixed to the beam 17 (see FIG. 2).

Next, the following describes the frame member 6 in the specific region 34 focusing on configurations that differ from those of the frame member 6 in the general region 35. As shown in FIGS. 1, 2, and 4, the beams 17 are not provided in the specific region 34. The frame member 6 in the specific region 34 includes a plurality of connecting members 47. The plurality of connecting members 47 are disposed separately from each other at a plurality of positions in the up-down direction Z. The connecting members 47 extend along the depth direction X. The connecting members 47 each connect a back-face-side support 15 and a front-face-side support 14 disposed at corresponding positions in the width direction Y, and support a slide mechanism 40. As described above, the frame member 6 in the general region 35 is not provided with the slide mechanisms 40, but the frame member 6 in the specific region 34 is provided with the slide mechanisms 40.

3-3. Placement Section Accessory Member

Figure 5:
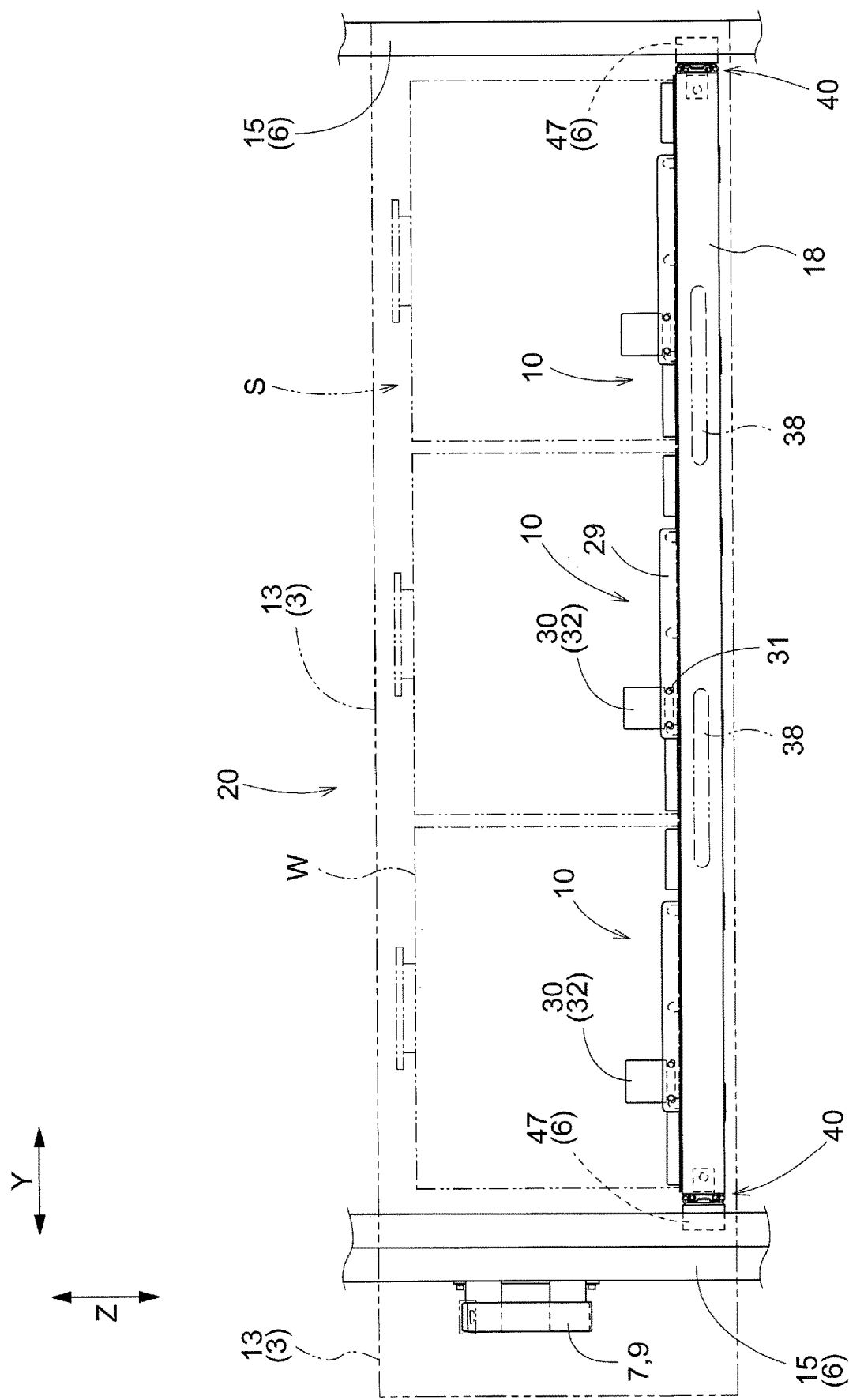
FIG. 5 is a partial enlarged view showing a positional relationship between the placement section module and back-face-side frame portions viewed in a depth direction.

As shown in FIGS. 5 and 7, in the present embodiment, the placement section accessory members 30 are on the back face side X2 in the depth direction relative to storage regions S formed on the corresponding placement sections 10, and overlap the storage regions S as viewed in the depth direction. Also, in this example, the placement section accessory members 30 are on the front face side X1 in the depth direction relative to the cover 3. That is, the placement section accessory members 30 are located between the cover 3 and the storage regions S. In the illustrated example, each of the placement section accessory members 30 is fixed to the fixed portion 11 of the corresponding placement section 10 via a first bracket 29. The placement section accessory member 30 and the first bracket 29 are fixed by being fastened with a first fastening member 31.

In the illustrated example, the placement section accessory members 30 constitute an article detection sensor 32 for detecting the presence or absence of articles W placed on the placement sections 10. Specifically, the placement section accessory members 30 are reflective plate portions constituting the article detection sensor 32. That is, the placement section accessory members 30 cooperate with a light emitting/receiving portion 36 (see FIG. 1) provided in the transfer device 83 and function as the article detection sensor 32. Specifically, if no article W is placed on a placement section 10 that has been selected as a transfer target place in a state where the transfer device 83 is at a transfer preparation position corresponding to the placement section 10, light emitted from the light emitting/receiving portion 36 reaches the corresponding placement section accessory member 30 (reflective plate portion), and light reflected off the placement section accessory member 30 is received by the light emitting/receiving portion 36. Here, the placement section accessory member 30 is formed with use of a retroreflective material that reflects incident light toward a light source. On the other hand, if an article W is placed on the placement section 10 selected as the transfer target place, light emitted from the light emitting/receiving portion 36 is interrupted by the article W and does not reach the corresponding placement section accessory member 30, and accordingly, the light emitting/receiving portion 36 does not receive light. The article detection sensor 32 detects the presence or absence of an article W placed on the placement section 10 based on whether or not the light emitting/receiving portion 36 receives reflected light.

3-4. Cover

As shown in FIG. 1, the cover 3 covers the back face 2B of the storage rack 2. In the present embodiment, the cover 3 covers an entirety of the back face 2B of the storage rack 2. The cover 3 is on the back face side X2 in the depth direction relative to the plurality of storage regions S. In the present embodiment, the cover 3 includes a fixed cover member 13K and a plurality of cover members 13, which will be described later. The fixed cover member 13K is fixed to the frame member 6. On the other hand, each of the plurality of cover members 13 is attached to a placement section module 20, which will be described later, and is configured to slide in the depth direction X together with the placement section module 20 by means of the slide mechanisms 40. On the other hand, the fixed cover member 13K is fixed to the frame member 6 so as to cover a remaining portion of the back face 2B in which the cover members 13 are not provided. That is, in this example, the plurality of cover members 13 are next to each other in the up-down direction Z and the width direction Y in the specific region 34 in which the slide mechanisms 40 are provided, and the fixed cover member 13K is in the general region 35 in which the slide mechanisms 40 are not provided.

4. Placement Section Module and Slide Mechanism

Figure 8:
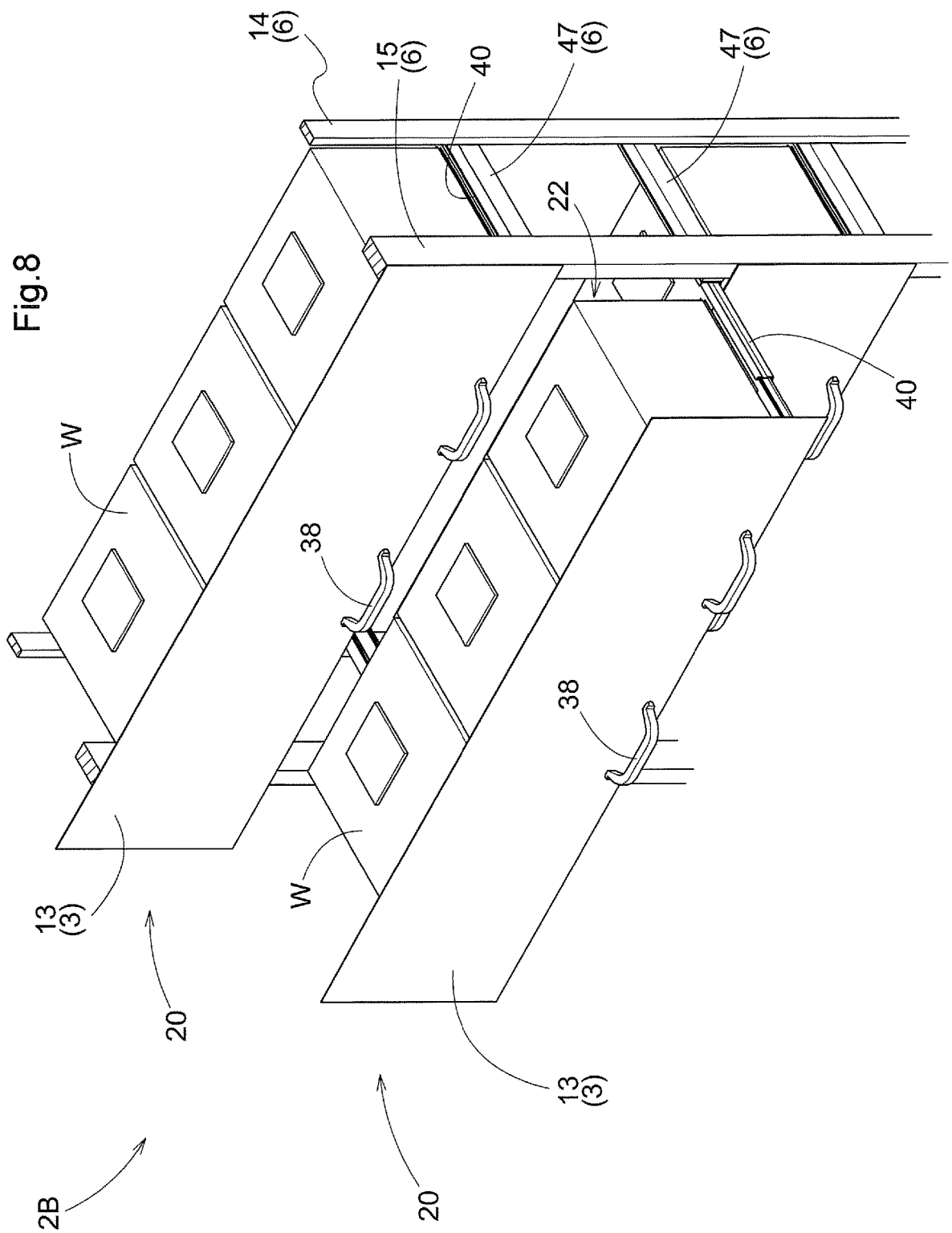
FIG. 8 is a perspective view of a placement section module at the reference position and a placement section module at the protruding position.

As shown in FIGS. 2 and 8, the automated warehouse 1 includes the placement section module 20 that includes one placement section 10 or a plurality of placement sections 10 adjacent to each other in the width direction Y. In the present embodiment, the automated warehouse 1 includes a plurality of placement section modules 20. Each of the plurality of placement section modules 20 includes a plurality of placement sections 10 adjacent to each other in the width direction Y. In this example, the plurality of placement section modules 20 include the same number of placement sections 10. In the illustrated example, each placement section module 20 includes three placement sections 10 (see FIG. 5). Here, the number of placement sections 10 included in one placement section module 20 is not limited to three, and may be two, or four or more.

As shown in FIGS. 2 and 8, in the present embodiment, the plurality of placement section modules 20 are arranged next to each other in the up-down direction Z. Furthermore, the plurality of placement section modules 20 are arranged side by side in the width direction Y as well. In this example, the placement section modules 20 are in the specific region 34. When a plurality of placement section modules 20 next to each other in the up-down direction Z are collectively referred to as a placement section module group 20T, a plurality of placement section module groups 20T are arranged side by side in the width direction Y (see FIG. 2). In the illustrated example, each of the plurality of placement section module groups 20T includes placement sections 10 located in a plurality of rows including the bottom row (in this example, the first through fourth rows as counted from the bottom). Each row of each placement section module group 20T includes a single placement section module 20.

As shown in FIGS. 2, 3, and 7, each placement section module 20 is supported by the frame member 6 via the slide mechanisms 40. In the present embodiment, each placement section module 20 is supported by the frame member 6 via the slide mechanisms 40 in such a manner that the placement section module 20 is slidable in the depth direction X. The following describes specific configurations of the placement section module 20 and the slide mechanisms 40.

As shown in FIGS. 3, 4, and 5, in this example, each placement section module 20 includes a plurality of placement sections 10 and the support member 18 supporting the plurality of placement sections 10. The support member 18 extends along the width direction Y and is supported by the connecting members 47 via the slide mechanisms 40. The support member 18 is on the back face side X2 in the depth direction relative to the storage regions S. In the illustrated example, the support member 18 supports the plurality of (here, three) placement sections 10 arranged side by side in the width direction Y. The fixed portion 11 of each placement section 10 is fixed to the support member 18.

Figure 6:
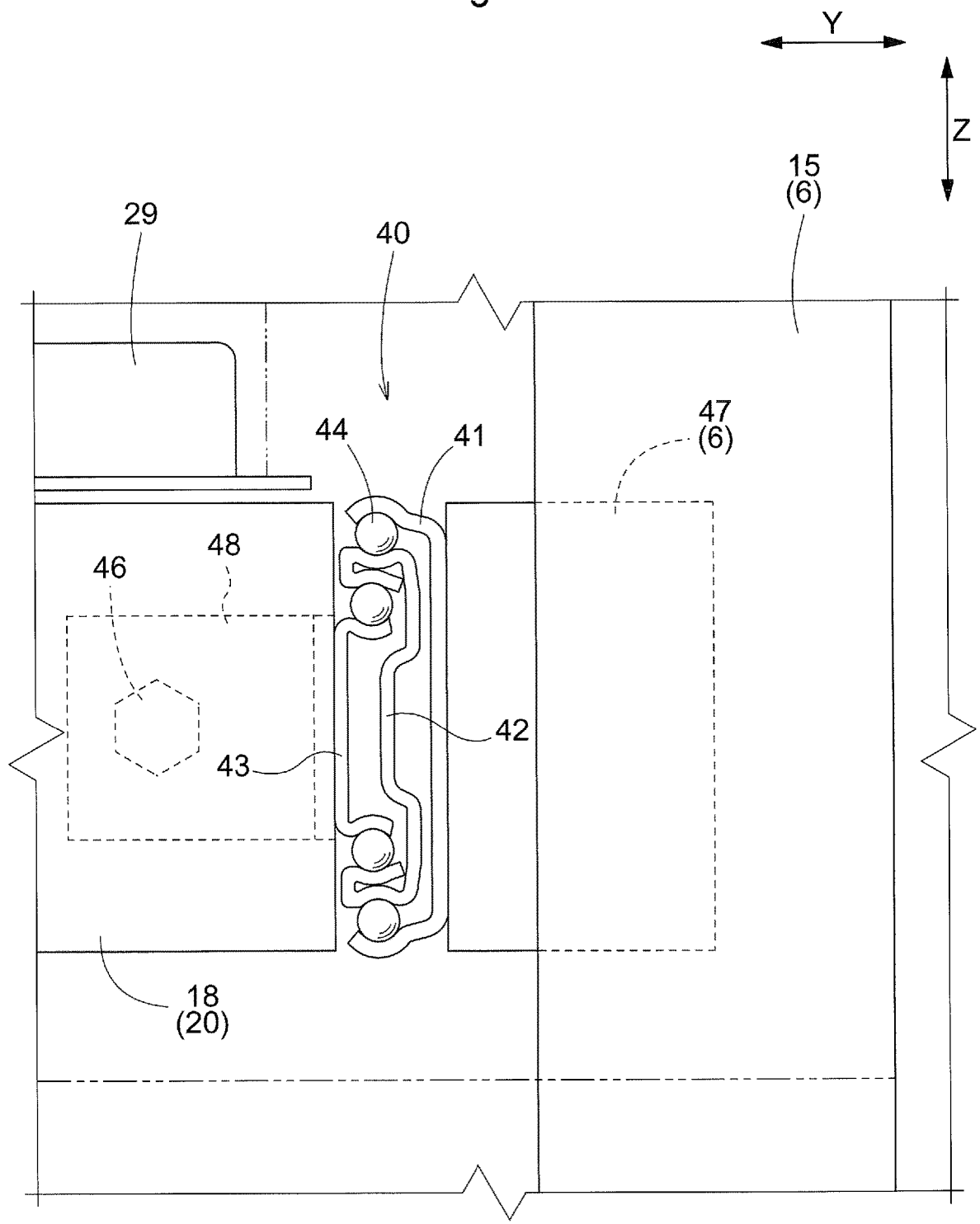
FIG. 6 shows a cross section of a slide mechanism viewed in the depth direction.

Also, as shown in FIGS. 3, 4, 6, and 7, in this example, the slide mechanisms 40 connect the placement section module 20 and the frame member 6 and guide the placement section module 20 in such a manner that the placement section module 20 is movable in the depth direction X relative to the frame member 6. The slide mechanisms 40 are attached to the connecting members 47 and extend along the depth direction X. The slide mechanisms 40 are provided on both sides of the placement section module 20 in the width direction Y. The two slide mechanisms 40 on both sides in the width direction Y support the single placement section module 20. As shown in FIGS. 6 and 7, in this example, each slide mechanism 40 includes a first slide rail portion 41 that is fixed to the connecting member 47, a second slide rail portion 42 that is held by the first slide rail portion 41, a slider portion 43 that is held by the second slide rail portion 42, and a plurality of balls 44. The second slide rail portion 42 is held by the first slide rail portion 41 in such a manner as to be movable in the depth direction X. The slider portion 43 is held by the second slide rail portion 42 in such a manner as to be movable in the depth direction X. The slider portion 43 is fixed to the placement section module 20. More specifically, the slider portions 43 of the slide mechanisms 40 on both sides in the width direction Y are respectively fixed to two end portions of the support member 18 in the width direction Y. In the illustrated example, the slider portions 43 are fixed to the support member 18 via second brackets 48 (see FIG. 6). The second brackets 48 are fixed to the support member 18 by being fastened with second fastening members 46. In this example, a slider including the plurality of balls 44 and the slide rails are used as the slide mechanism 40, but it is possible to use various known slide mechanisms 40 such as a ball spline and a linear bushing, for example. With the configuration described above, in the present embodiment, the plurality of placement section modules 20 are each supported by the frame member 6 via the slide mechanisms 40 in such a manner as to be slidable independently of each other. That is, the plurality of placement section modules 20 are slidable in the depth direction X relative to the frame member 6 independently of each other.

As shown in FIGS. 3, 4, and 7, the slide mechanisms 40 support the corresponding placement section module 20 in such a manner that the placement section module 20 is slidable relative to the frame member 6 between a reference position T1 and a protruding position T2 that is on the back face side X2 in the depth direction relative to the reference position T1. When the placement section module 20 is at the reference position T1, the placement sections 10 are on the front face side X1 in the depth direction relative to a frame member back surface 22 that is a surface of the frame member 6 on the back face side X2 in the depth direction. When the placement section module 20 is at the protruding position T2, the placement sections 10 protrude from the frame member back surface 22 toward the back face side X2 in the depth direction. With this configuration, the placement section module 20 is movable between the reference position T1 and the protruding position T2. In the present embodiment, the plurality of placement sections 10, the support member 18, and the cover member 13, which will be described later, slide together as the placement section module 20 between the reference position T1 and the protruding position T2.

As shown in FIGS. 7 and 8, the cover member 13 constituting a portion of the cover 3 covers a face 23 of the placement section module 20 on the back face side X2 in the depth direction. In the present embodiment, the faces 23 of the respective placement section modules 20 on the back face side X2 in the depth direction are covered with the cover members 13 constituting a portion of the cover 3. Each placement section module 20 is provided with a single cover member 13. The single cover member 13 covers the entirety of the face 23 of the placement section module 20 on the back face side X2 in the depth direction. In this example, the cover member 13 is a plate-shaped member. The cover member 13 is attached to the support member 18 of the placement section module 20. More specifically, the cover member 13 is fixed to a surface of the support member 18, which surface faces the back face side X2 in the depth direction. The cover member 13 covers the plurality of placement sections 10 arranged side by side in the width direction Y, the storage regions S formed on the respective placement sections 10 (i.e., articles W placed on the placement sections 10), and the slide mechanisms 40 as viewed in the depth direction. Also, the cover member 13 is formed in such a manner that when two placement section modules 20 adjacent to each other in the up-down direction Z are both at the reference position T1, the cover members 13 adjacent to each other in the up-down direction Z are in contact with each other with no gap formed therebetween. In the illustrated example, the cover member 13 has a rectangular shape elongated in the width direction Y. The dimension of the cover member 13 in the up-down direction Z is set larger than the length from a lower end of the placement section 10 to an upper end of an article W in a state where the article W is placed on the placement section 10. Also, the dimension of the cover member 13 in the width direction Y is set larger than the dimension of the single placement section module 20 in the width direction Y. In the illustrated example, the plurality of placement section module groups 20T are arranged side by side in the width direction Y. The cover member 13 is formed in such a manner that when two placement section modules 20 adjacent to each other in the width direction Y are both at the reference position T1, the cover members 13 adjacent to each other in the width direction Y are in contact with each other with no gap formed therebetween.

In this example, a handle portion 38 is attached to the cover member 13. The handle portion 38 is gripped by a worker or the like to move the placement section module 20 from the reference position T1 to the protruding position T2. The handle portion 38 is fixed to a surface of the cover member 13, which surface faces the back face side X2 in the depth direction. In the illustrated example, two handle portions 38 are provided side by side in the width direction Y on each cover member 13.

As shown in FIGS. 3 and 8, the placement section module 20 is configured in such a manner that the upper side of the storage regions S is exposed when the placement section module 20 is at the protruding position T2. In the present embodiment, the cover member 13 covering the placement section module 20 covers the back face side X2 of the placement section module 20 in the depth direction, but an upper face of the placement section module 20 is not provided with a member that covers the placement section module 20 like the cover member 13. Accordingly, each of the plurality of placement section modules 20 is configured in such a manner that the upper side of the storage regions S is exposed in a state where the placement section module 20 is at the protruding position T2 and another placement section module 20 adjacent to the upper side of the placement section module 20 is at the reference position T1. Therefore, a worker or the like can slide one of the plurality of placement section modules 20 arranged in the up-down direction Z to the protruding position T2 and easily take out an article W from the upper side of the placement section module 20.

5. Lock Mechanism

As shown in FIGS. 3, 4, and 5, in the present embodiment, the automated warehouse 1 includes a lock mechanism 9 that restricts sliding movement of the plurality of placement section modules 20 realized by the slide mechanisms 40. The lock mechanism 9 is switchable between a locked state in which sliding movement of all the placement section modules 20 is restricted and an unlocked state in which sliding movement of all the placement section modules 20 is allowed. In the present embodiment, the lock mechanism 9 enters the locked state to restrict sliding movement of all the placement section modules 20 in the depth direction X when power is supplied to the transport apparatus 4, i.e., when articles W can be transferred by the transport apparatus 4. On the other hand, when power is not supplied to the transport apparatus 4, the lock mechanism 9 enters the unlocked state to allow sliding movement of all the placement section modules 20 in the depth direction X. Here, when articles W can be transferred by the transport apparatus 4, there is no need to take out articles W from the back face 2B side of the storage rack 2. Accordingly, the lock mechanism 9 enters the locked state in a state where all the placement section modules 20 are at the reference position T1, and sliding movement of all the placement section modules 20 in the depth direction X is restricted. On the other hand, when power is not supplied to the transport apparatus 4, articles W cannot be taken out by the transport apparatus 4, and accordingly, it is necessary to allow a worker or the like to take out necessary articles W. Therefore, the lock mechanism 9 enters the unlocked state to allow all the placement section modules 20 to move between the reference position T1 and the protruding position T2.

As shown in FIGS. 3 and 4, the lock mechanism 9 includes a plurality of engagement protrusions 54 and a plurality of engagement portions 53 corresponding to the respective engagement protrusions 54. Each placement section module 20 is provided with an engagement protrusion 54 and an engagement portion 53. Specifically, the engagement protrusion 54 is attached to the cover member 13, and the engagement portion 53 is attached to the back-face-side support 15. The engagement protrusion 54 and the engagement portion 53 are disposed at corresponding positions in the up-down direction Z and the width direction Y. The engagement protrusion 54 and the engagement portion 53 engage with each other as a result of the placement section module 20 sliding to the reference position T1 from the back face side X2 in the depth direction relative to the reference position T1. In the state where the engagement protrusion 54 and the engagement portion 53 engage with each other, the engagement protrusion 54 is retained in the engagement portion 53 and kept from coming off the engagement portion 53 owing to a function of an electromagnetic lock 55 (see FIG. 9) provided inside the engagement portion 53. Thus, the lock mechanism 9 enters the locked state. On the other hand, in this example, power is not supplied to the electromagnetic lock 55 while power is not supplied to the transport apparatus 4. Accordingly, in the unlocked state, the engagement protrusion 54 easily comes off the engagement portion 53 and slides in the depth direction X together with the placement section module 20. Thus, the placement section module 20 is allowed to slide in the depth direction X in the unlocked state. Also, in this example, the storage rack 2 includes an operation portion 58 (see FIG. 9). A worker can operate the operation portion 58 to switch the lock mechanism 9 between the locked state and the unlocked state. In this example, the operation portion 58 is an operation switch provided on the storage rack 2. Note that there is no limitation to this configuration, and the operation portion 58 may be an operation switch provided on an operation panel of a control device 8 or the like, or a software switch operable with use of a terminal constituting the control device 8.

6. Reference Position Detection Device

As shown in FIGS. 2, 3, and 5, in the present embodiment, the automated warehouse 1 further includes a reference position detection device 7 configured to detect the presence of the placement section module 20 at the reference position T1. In this example, a plurality of reference position detection devices 7 are provided in correspondence with the respective placement section modules 20. In the illustrated example, the engagement protrusion 54 and the engagement portion 53 function as the reference position detection device 7. That is, when the engagement protrusion 54 engages with the engagement portion 53, a sensor 61 (see FIG. 9) provided inside the engagement portion 53 detects the engagement protrusion 54. Thus, the reference position detection device 7 can detect the presence of the placement section module 20 at the reference position T1. As described above, in the present embodiment, the reference position detection device 7 is composed of the engagement protrusion 54, the engagement portion 53, and the sensor 61.

7. Control Device

Figure 9:
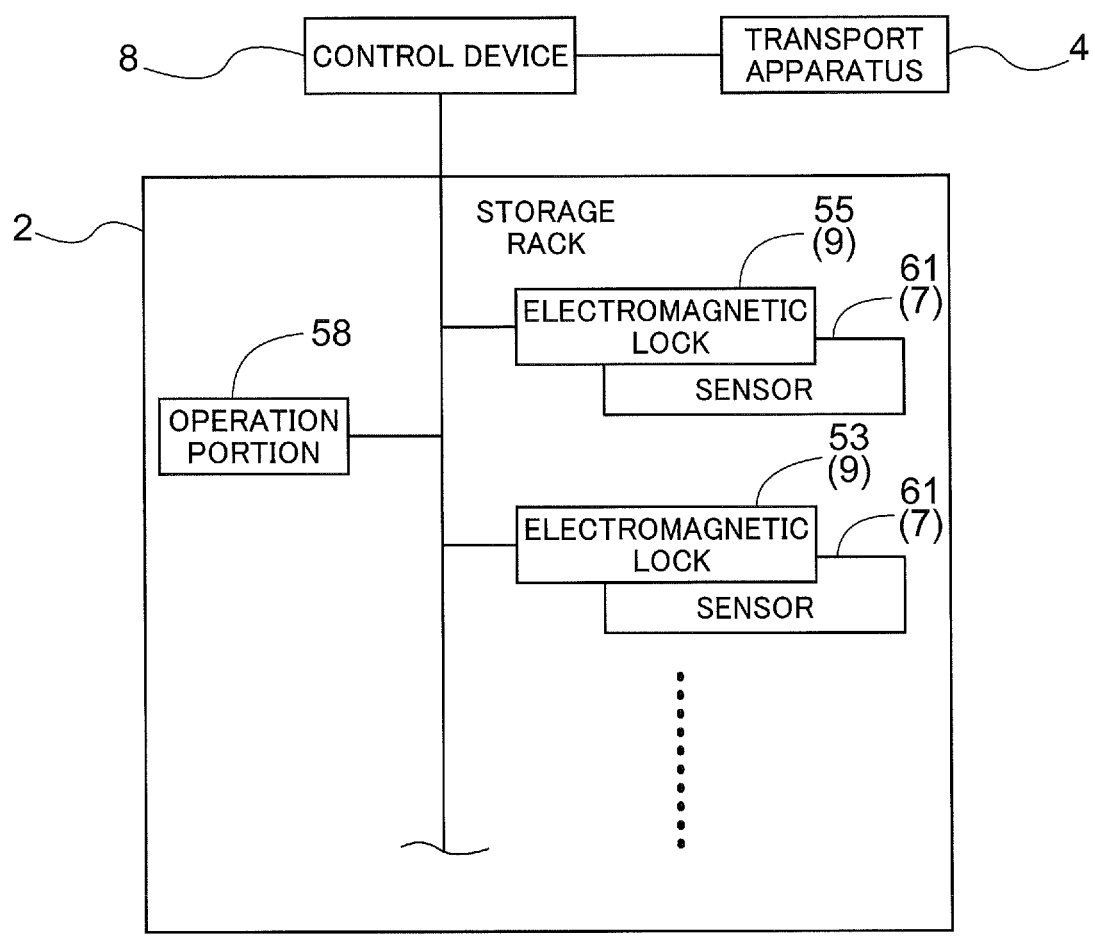
FIG. 9 is a control block diagram.

In order to realize the configuration described above, the automated warehouse 1 in the present embodiment further includes the control device 8 that controls the transport apparatus 4 as shown in FIG. 9. In this example, the control device 8 controls all electromagnetic locks 55 to cause the lock mechanism 9 to enter the locked state in the state where power is supplied to the transport apparatus 4, i.e., articles W can be transferred by the transport apparatus 4. This avoids a situation in which a worker slides the placement section modules 20 by mistake while the transport apparatus 4 is operating. When power supply to the transport apparatus 4 is interrupted due to a power failure or the like, for example, power supply to the electromagnetic locks 55 is interrupted as well, and accordingly, the lock mechanism 9 automatically switches from the locked state to the unlocked state. Therefore, the worker can move the placement section modules 20 from the reference position T1 to the protruding position T2 and take out articles W from the back face side of the storage rack 2. In this example, the control device 8 also controls the electromagnetic locks 55 to switch the lock mechanism 9 between the locked state and the unlocked state in response to an operation made by the worker or the like on the operation portion 58. In this case, the control device 8 can supply power only to the electromagnetic locks 55 or interrupt power supply to the electromagnetic locks 55 irrespective of whether or not power is supplied to the transport apparatus 4. As described above, the control device 8 controls the electromagnetic locks 55 to switch the lock mechanism 9 between the locked state and the unlocked state.

In the present embodiment, the control device 8 prohibits the transport apparatus 4 from operating in a case where the presence of the placement section modules 20 at the reference position T1 cannot be detected by the reference position detection devices 7. In this example, the control device 8 prohibits the transport apparatus 4 from operating, i.e., stops the transport apparatus 4 in a case where at least one placement section module 20 among the plurality of placement section modules 20 cannot be detected at the reference position T1 by the reference position detection devices 7. In other words, the control device 8 prohibits the transport apparatus 4 from operating unless the presence of all the placement section modules 20 at the reference position T1 is detected by the reference position detection devices 7. Accordingly, when power supply is restored after a power failure and the transport apparatus 4 is started again, for example, the transport apparatus 4 does not operate if at least one placement section module 20 among the plurality of placement section modules 20 is not at the reference position T1. Also, when the worker operates the operation portion 58 to switch the lock mechanism 9 from the unlocked state to the locked state as well, the transport apparatus 4 does not operate if at least one placement section module 20 among the plurality of placement section modules 20 is not at the reference position T1.

8. Other Embodiments

Next, other embodiments of the automated warehouse will be described.

(1) In the above embodiment, a configuration is described as an example in which each placement section module 20 includes a plurality of placement sections 10 adjacent to each other in the width direction Y. However, there is no limitation to this configuration, and a configuration is also possible in which each placement section module 20 includes only one placement section 10. Alternatively, a configuration is also possible in which some placement section modules 20 among the plurality of placement section modules 20 each include only one placement section 10, and the remaining placement section modules 20 each include a plurality of placement sections 10.

(2) In the above embodiment, a configuration is described as an example in which the automated warehouse 1 includes a plurality of placement section modules 20 arranged next to each other in the up-down direction Z and the width direction Y. However, there is no limitation to this configuration, and a configuration is also possible in which the automated warehouse 1 includes only one placement section module 20. Alternatively, a configuration is also possible in which the placement section modules 20 are arranged in a plurality of rows in the up-down direction Z and in a single column in the width direction Y. Alternatively, a configuration is also possible in which the placement section modules 20 are only arranged in a plurality of columns in the width direction Y.

(3) In the above embodiment, a configuration is described as an example in which the control device 8 prohibits the transport apparatus 4 from operating in a case where some placement section modules 20 among the plurality of placement section modules 20 are not at the reference position T1. However, there is no limitation to this configuration, and a configuration is also possible in which the control device 8 does not prohibit the transport apparatus 4 from operating even in the case where some placement section modules 20 among the plurality of placement section modules 20 are not at the reference position T1. In such a case, the control device 8 preferably controls the transport apparatus 4 in such a manner as to only prohibit the transport apparatus 4 from transferring articles W to the placement section modules 20 that are not at the reference position T1 and allow the transport apparatus 4 to transfer articles W to the other placement section modules 20 that are at the reference position T1.

(4) In the above embodiment, a configuration is described as an example in which the automated warehouse 1 includes the lock mechanism 9 that is switchable between the locked state in which sliding movement of all the placement section modules 20 is restricted and the unlocked state in which sliding movement of all the placement section modules 20 is allowed. However, there is no limitation to this configuration, and a configuration is also possible in which the automated warehouse 1 includes a plurality of lock mechanisms 9 and each lock mechanism 9 is configured to switch some placement section modules 20 between the locked state and the unlocked state. Alternatively, a configuration is also possible in which the automated warehouse 1 does not include the lock mechanism 9.

(5) The configurations disclosed in each embodiment described above (including the above embodiment and the other embodiments, the same applies hereinafter) can be applied in combination with configurations disclosed in other embodiments so long as no contradiction arises. The embodiments disclosed in the present specification including the other configurations are examples in all aspects, and can be modified as appropriate within a range not departing from the gist of the present disclosure.

9. Outline of the Above Embodiment

The following describes an outline of the automated warehouse described above.

An automated warehouse includes: a storage rack configured to store a plurality of articles; and a transport apparatus configured to travel along a front face of the storage rack and transport the articles, wherein the storage rack includes: a plurality of placement sections on which the articles are placeable; a frame member supporting the plurality of placement sections; and a cover, the cover covers a back face of the storage rack, the plurality of placement sections are next to each other in both an up-down direction and a width direction orthogonal to the up-down direction as viewed in a depth direction that is a direction from the front face toward the back face or from the back face toward the front face, and storage regions in which the articles are storable are respectively formed between pairs of two placement sections adjacent to each other in the up-down direction, the automated warehouse further includes at least one placement section module including at least one placement section, the at least one placement section including one of the placement sections or a plurality of the placement sections adjacent to each other in the width direction, the at least one placement section module is supported by the frame member via a slide mechanism, the slide mechanism supports the at least one placement section module in such a manner that the at least one placement section module is slidable relative to the frame member between a reference position and a protruding position that is on a back face side in the depth direction relative to the reference position, the back face side in the depth direction being the back face side as seen from the front face side in the depth direction, when the at least one placement section module is at the reference position, the at least one placement section is on a front face side in the depth direction relative to a frame member back surface that is a surface of the frame member on the back face side in the depth direction, the front face side in the depth direction being the front face side as seen from the back face side in the depth direction, when the at least one placement section module is at the protruding position, the at least one placement section protrudes from the frame member back surface toward the back face side in the depth direction, the cover includes a cover member covering a face of the at least one placement section module on the back face side in the depth direction, and the at least one placement section module is configured in such a manner that an upper side of the storage regions is exposed in a state where the at least one placement section module is at the protruding position.

According to this configuration, when the placement section module is slid to the protruding position, articles can be easily taken out from the upper side of the placement section module. Also, when the placement section module is at the reference position, the back face of the storage rack can be covered with the cover including the cover member.

As described above, the automated warehouse is configured to take out articles from the upper side of the placement section module in the state where the placement section module has been slid to the protruding position, and therefore, a worker can easily take out articles when compared with a case where the cover covering the back face of the plurality of placement sections is merely removed to take out articles in the depth direction. Moreover, there is no need to make the distance between the plurality of placement sections in the up-down direction large in order to make it easy for the worker to take out articles as in the case where articles are taken out in the depth direction, and therefore, it is easy to increase the efficiency of storing articles in the storage rack.

Here, it is preferable that the at least one placement section module includes a plurality of placement section modules arranged next to each other in the up-down direction, each of the plurality of placement section modules is supported by the frame member via the slide mechanism in such a manner that the placement section modules are slidable independently of each other, and each of the plurality of placement section modules is configured in such a manner that the upper side of the storage regions is exposed in a state where the placement section module is at the protruding position and another placement section module adjacent to an upper side of the placement section module is at the reference position.

According to this configuration, when one of the plurality of placement section modules arranged in the up-down direction is slid to the protruding position, articles can be easily taken out from the upper side of the placement section module. When the plurality of placement section modules are arranged in the up-down direction as described above, articles can be easily taken out from each of the placement section modules. Also, the efficiency of storing articles in the storage rack can be further increased because the distance between placement sections in the up-down direction of each placement section module need not be made large as in the case where articles are taken out in the depth direction.

It is preferable that the automated warehouse further includes a reference position detection device configured to detect presence of the at least one placement section module at the reference position; and a control device configured to control the transport apparatus, wherein the control device prohibits the transport apparatus from operating in response to the presence of the at least one placement section module at the reference position not being detected by the reference position detection device.

If the transport apparatus attempts to transfer an article to a placement section included in the placement section module in a state where the placement section module is not at the reference position, not only the article cannot be transferred properly but also the article may be damaged. According to this configuration, the transport apparatus does not operate when the presence of the placement section module at the reference position cannot be detected by the reference position detection device. Therefore, such situations can be avoided.

It is preferable that the at least one placement section module includes a plurality of placement section modules, the automated warehouse further includes a lock mechanism configured to restrict sliding movement of the plurality of placement section modules realized by the slide mechanism, and the lock mechanism is switchable between a locked state in which sliding movement of all the placement section modules is restricted and an unlocked state in which sliding movement of all the placement section modules is allowed.

According to this configuration, it is possible to avoid a situation in which a worker slides the placement section modules by mistake, by switching the lock mechanism to the locked state at normal time when there is no need to take out articles from the back face side of the storage rack.

INDUSTRIAL APPLICABILITY

The techniques according to the present disclosure are applicable to automated warehouses.

What is claimed is:

1. An automated warehouse comprising:
a storage rack configured to store a plurality of articles; and
a transport apparatus configured to travel along a front face of the storage rack and transport the articles,
wherein the storage rack comprises:
a plurality of placement sections on which the articles are placeable;
a frame member supporting the plurality of placement sections; and
a cover,
wherein:
the cover covers a back face of the storage rack,
the plurality of placement sections are next to each other in both an up-down direction and a width direction orthogonal to the up-down direction as viewed in a depth direction that is a direction from the front face toward the back face or from the back face toward the front face, and storage regions in which the articles are storable are respectively formed between pairs of two placement sections adjacent to each other in the up-down direction,
the automated warehouse further comprises at least one placement section module comprising at least one placement section, the at least one placement section comprising one of the placement sections or a plurality of the placement sections adjacent to each other in the width direction,
the at least one placement section module is supported by the frame member via a slide mechanism,
the slide mechanism supports the at least one placement section module in such a manner that the at least one placement section module is slidable relative to the frame member between a reference position and a protruding position that is on a back face side in the depth direction relative to the reference position, the back face side in the depth direction is the back face side as seen from the front face side in the depth direction,
when the at least one placement section module is at the reference position, the at least one placement section is on a front face side in the depth direction relative to a frame member back surface that is a surface of the frame member on the back face side in the depth direction, the front face side in the depth direction is the front face side as seen from the back face side in the depth direction,
when the at least one placement section module is at the protruding position, the at least one placement section protrudes from the frame member back surface toward the back face side in the depth direction,
the cover includes a cover member covering a face of the at least one placement section module on the back face side in the depth direction, and
the at least one placement section module is configured in such a manner that an upper side of the storage regions is exposed in a state where the at least one placement section module is at the protruding position.

2. The automated warehouse according to claim 1, wherein:
the at least one placement section module comprises a plurality of placement section modules arranged next to each other in the up-down direction, each of the plurality of placement section modules is supported by the frame member via the slide mechanism in such a manner that the placement section modules are slidable independently of each other, and
each of the plurality of placement section modules is configured in such a manner that the upper side of the storage regions is exposed in a state where the placement section module is at the protruding position and another placement section module adjacent to an upper side of the placement section module is at the reference position.

3. The automated warehouse according to claim 1, further comprising:
a reference position detection device configured to detect presence of the at least one placement section module at the reference position; and
a control device configured to control the transport apparatus,
wherein the control device prohibits the transport apparatus from operating in response to the presence of the at least one placement section module at the reference position not being detected by the reference position detection device.

4. The automated warehouse according to claim 1, wherein:
the at least one placement section module comprises a plurality of placement section modules,
the automated warehouse further comprises a lock mechanism configured to restrict sliding movement of the plurality of placement section modules realized by the slide mechanism, and
the lock mechanism is switchable between a locked state in which sliding movement of all the placement section modules is restricted and an unlocked state in which sliding movement of all the placement section modules is allowed.

* * * * *